(12) United States Patent
Clark et al.

(10) Patent No.: US 6,774,696 B2
(45) Date of Patent: Aug. 10, 2004

(54) LEVEL SHIFTER AND VOLTAGE TRANSLATOR

(75) Inventors: Lawrence T. Clark, Phoenix, AZ (US); Shay P. Demmons, Chandler, AZ (US); Franco Ricci, Chandler, AZ (US); Tim Beatty, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/318,689

(22) Filed: Dec. 12, 2002

(65) Prior Publication Data

US 2004/0113677 A1 Jun. 17, 2004

(51) Int. Cl.[7] .................................................. H03L 5/00
(52) U.S. Cl. ......................................................... 327/333
(58) Field of Search ................................. 327/333, 427, 327/434, 437; 326/63, 68, 80, 81

(56) References Cited

U.S. PATENT DOCUMENTS

| | | | | | |
|---|---|---|---|---|---|
| 5,321,324 A | * | 6/1994 | Hardee et al. | ................. | 326/62 |
| 6,020,762 A | * | 2/2000 | Wilford | ........................ | 326/81 |
| 6,563,362 B2 | * | 5/2003 | Lambert | ...................... | 327/333 |
| 6,639,427 B2 | * | 10/2003 | Dray et al. | .................... | 326/83 |

* cited by examiner

Primary Examiner—My-Trang Nu Ton
(74) Attorney, Agent, or Firm—Lanny L. Parker

(57) ABSTRACT

A level translator block receives a control signal and a data signal and provides an interface between circuitry operating in a first voltage domain and circuitry operating in a second voltage domain. Thick-oxide transistors are appropriately used in the level translator block to reduce gate leakage currents when translating signals.

21 Claims, 2 Drawing Sheets

US 6,774,696 B2

LEVEL SHIFTER AND VOLTAGE TRANSLATOR

The trend toward portable products suggests conserving power by lowering the operating voltage of the electronic devices. However, the lowered operating voltage poses problems, with particular importance placed on the stability of the memory that may result in device failures as the microprocessor operating voltages are lowered. In order to improve performance some embedded processors may incorporate different voltage domains to allow devices or components to operate at different voltage potentials.

Voltage translator circuits enable designers to implement voltage interfacing between these various voltage domains. The processor core in a notebook computer may separate memories, I/O buffer devices, and arithmetic processing logic into different voltage domains, using translator circuits to expedite translation between the voltage digital interfaces. Thus, the voltage translator circuits are the intermediary circuit formed between low voltage integrated logic circuits and high voltage integrated logic circuits located in the various voltage domains.

Thus, there is a continuing need for better ways to provide flexibility for operating a microprocessor or other digital circuits at desired voltage domains while preserving high bandwidth operation and the stability of any embedded devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
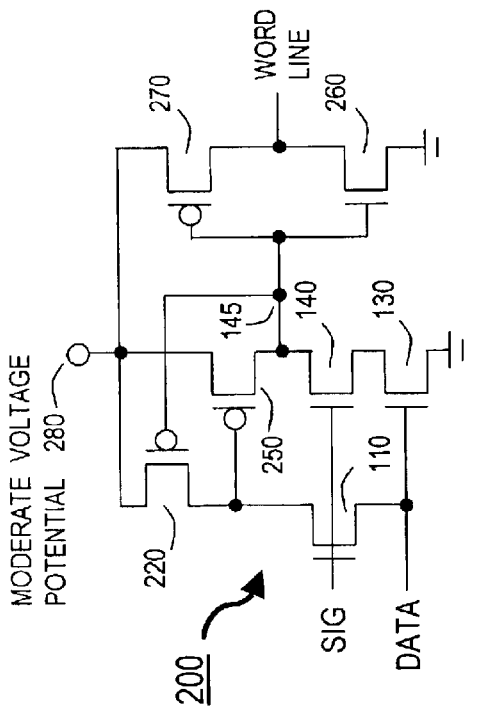
FIG. 1 is a schematic for a first embodiment of a voltage translator circuit in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Also, in the following description and claims, the terms "thin-oxide" and "thick-oxide," along with their derivatives, may be used. The use of these terms implies the integration of at least two transistors, with the gate oxide thickness of one transistor differing from the gate oxide thickness of the second transistor, i.e., the two transistors are processed to intentionally have a different gate oxide thickness. Thus, the adjectives "thin" and "thick" are used to make a distinction between transistors and to differentiate one group of transistors from another group of transistors. Used as such, the terms "thin" and "thick" are relative, not absolute terms. This is common in the art as the voltage tolerance of a transistor is proportional to the gate oxide thickness.

Embodiments of the present invention may be used in a variety of applications, with the claimed subject matter incorporated into microcontrollers, general-purpose microprocessors, Digital Signal Processors (DSPs), Reduced Instruction-Set Computing (RISC), Complex Instruction-Set Computing (CISC), among other electronic components. In particular, the present invention may be used in smart phones, communicators and Personal Digital Assistants (PDAs), base band and application processors, automotive infotainment and other products. However, it should be understood that the scope of the present invention is not limited to these examples.

The principles of the present invention may be practiced in wireless devices that are connected in a Code Division Multiple Access (CDMA) cellular network such as IS-95, CDMA 2000, and UMTS-WCDMA and distributed within an area for providing cell coverage for wireless communication. Additionally, the principles of the present invention may be practiced in Wireless Local Area Network (WLAN), 802.11a–b, Orthogonal Frequency Division Multiplexing (OFDM), Ultra Wide Band (UWB), among others. The type of network connection is not intended to limit the scope of the present invention.

FIG. 1 is a schematic for a first embodiment of a voltage translator circuit 100 in accordance with the present invention. Translator circuit 100 has two sections, with the first section including transistors 110 and 120 and the second section including transistors 130, 140 and 150. In particular, transistor 110 is a thin-oxide N-channel device having a gate to receive an input signal SIG. The source of transistor 110 is connected to an input that receives a value at the DATA input, while the drain of transistor 110 is connected to the drain of transistor 120. Transistor 120 is a thick-oxide P-channel device having a source connected to a power conductor 180 that receives a high voltage potential. The voltage potential supplied to power conductor 180 is a value that exceeds the long term Time Dependent Dielectric Breakdown (TDDB) for thin gate devices, i.e., a value that prevents gate oxides from damage due to higher electric fields.

In the second section, transistors 130 and 140 are thin-oxide N-channel stacked devices. Transistor 130 has a gate to receive the signal SIG, a source connected to a power conductor to receive a voltage potential such as, for example, ground. Transistor 140 has a gate to receive the signal SIG and a source connected to the drain of transistor 130. Transistor 150 is a thick-oxide P-channel device having a gate connected to the commonly connected drains of transistors 110 and 120, a drain connected to the drain of transistor 140 to form node 145, and a source connected to power conductor 180. The gate of transistor 120 and the gates of the inverter formed by transistors 160 and 170 are connected to node 145. Transistor 160 is a thin-oxide N-channel device and transistor 170 is a thick-oxide P-channel device. The output of the inverter provides a WORD LINE signal to a Static Random Access Memory (SRAM) or other memory types. The inverter provides increased current gain.

Again, a thick-oxide transistor refers to a semiconductor device having a gate oxide thickness that is intentionally processed to be greater than the gate oxide thickness of a thin-oxide transistor. The gate leakage current ($J_{OX}$) of thick-oxide transistors is significantly less than the $J_{OX}$ of thin-oxide transistors. The thick-oxide transistors provide a reduced gate leakage current and allow lower standby power when compared to thin-oxide transistors. Generally the thicker gate oxide devices have higher threshold voltages and lower $I_{OFF}$ currents. Consequently, the thicker gate oxide devices are designed to operate with higher voltages and used to limit the standby power.

In operation, the signal SIG may be asserted high for active operation. The signal SIG may be generated by circuitry supplied by a lower voltage power supply. Note that transistors 110 and 140 protect, via their cascode configuration, the driving gate (not shown) that generates the signal SIG and transistor 130. A logic zero or logic one may be written to voltage translator circuit 100 by application of a voltage at the DATA input. If the DATA input is written with a zero value, then node 115 is pulled low. On the other hand, if the DATA input is written with a logic one value (at the lower $V_{CC}$), then transistor 130 is conductive and the opposite state is written to voltage translator circuit 100.

Figure 2:
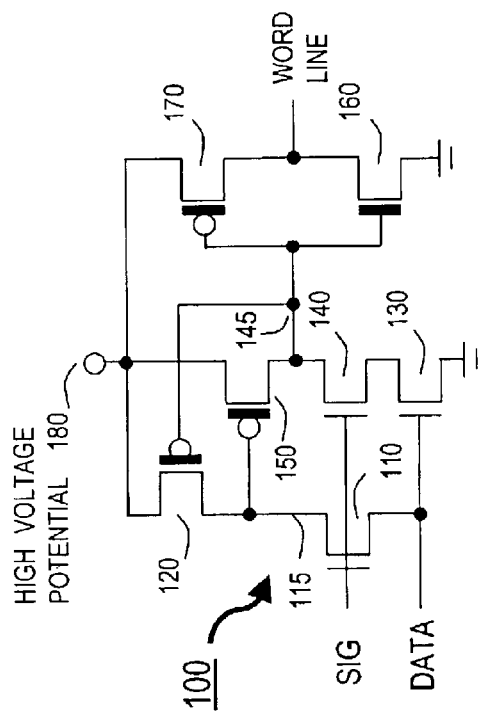
FIG. 2 is a schematic for a second embodiment of a voltage translator circuit in accordance with the present invention.

FIG. 2 is a schematic for a second embodiment of a voltage translator circuit 200 in accordance with the present invention. This embodiment differs from the embodiment shown in FIG. 1 in that the thick-oxide P-channel transistors 120, 150 and 170 have been replaced with respective thin-oxide P-channel transistors 220, 250 and 270. In addition, the thick-oxide N-channel transistor 160 has been replaced with a thin-oxide N-channel transistor 260. It is desirable that thin gate oxide transistors be used to provide greater performance and further achieve a smaller die size.

Figure 3:
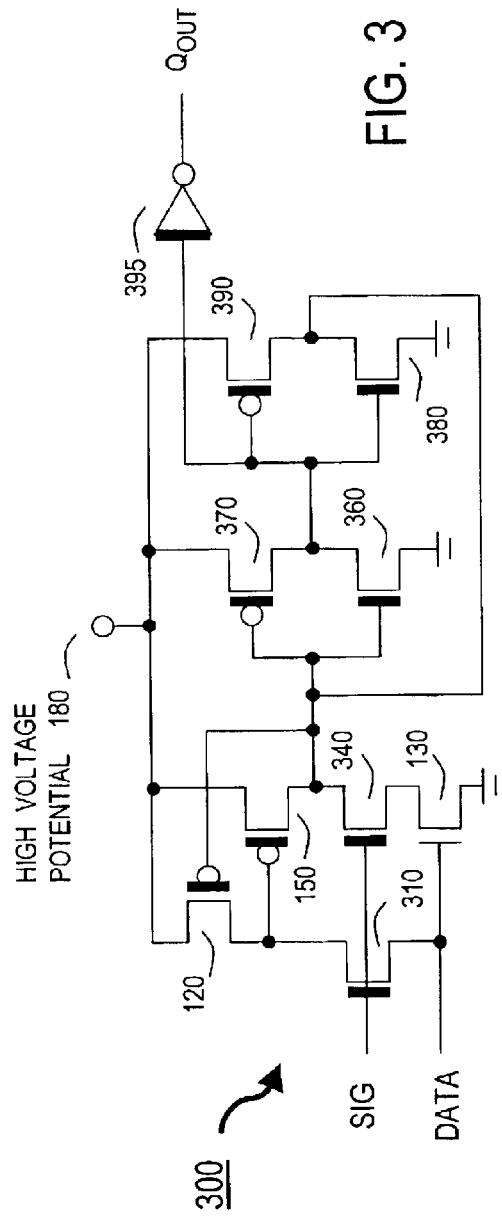
FIG. 3 is a schematic for a third embodiment of a voltage translator circuit with a thick gate latch implementation in accordance with the present invention.

FIG. 3 is a schematic of a voltage translator circuit 300 implemented with a thick gate latch in accordance with the present invention. Referring to FIGS. 1 and 3, transistors 120, 130 and 150 are similar in both embodiments. However, the thin-oxide N-channel transistors 110 and 140 shown in FIG. 1 have been replaced with respective thick-oxide N-channel transistors 310 and 340 in FIG. 3. Further, a latch in FIG. 3 replaces the inverter formed by transistors 160 and 170 in FIG. 1. The latch has a first inverter formed by thick-oxide N-channel transistor 360 and thick-oxide P-channel transistor 370 and a second inverter formed by thick-oxide N-channel transistor 380 and thick-oxide P-channel transistor 390. The output of the second inverter is connected to the input of the first inverter. A thick-oxide buffer 395 receives a signal generated by transistors 360 and 370 and provides an output signal $Q_{OUT}$. Although buffer 395 is shown as an inverting buffer, a non-inverting buffer may be used by simply connecting the buffer to an appropriate node in the latch.

This configuration may be used to voltage shift a signal from a thin gate domain, where power may be removed, to a high voltage domain, where power is maintained. De-asserting the signal SIG to zero volts effectively isolates the latch and power may then be removed from either of the low voltage supplies where the signals SIG and DATA get generated. With the signal SIG de-asserted, the latched state value is maintained.

By way of example to describe operation (referring to FIG. 1), one case may have the signal SIG and the signal at the DATA input both with logic one values. With this combination of values for input signals the gate and source of transistor 110 have substantially the same voltage, causing transistor 110 to be cutoff. Transistors 130 and 140 are in conduction and pull node 145 low, which in turn causes transistor 120 to conduct and pull the gate of transistor 150 to a logic one value. The output signal WORD LINE is then asserted. Note that the signal SIG may be an event driven control signal that places the microprocessor in a low power state where the logic levels on values at the DATA input may become ambiguous without affecting the latch state, or alternatively, the signal SIG may be a periodic clock signal.

For another case the signal SIG may be a logic one value and the signal at the DATA input may be a logic zero value. With this combination of values for input signals transistor 130 is cutoff and transistor 110 is in conduction, pulling the gate of transistor 150 to a logic zero value. With a zero value on the gate of transistor 150, the transistor is in conduction and pulls node 145 to a logic one value, which de-asserts the output signal WORD LINE.

Figure 4:
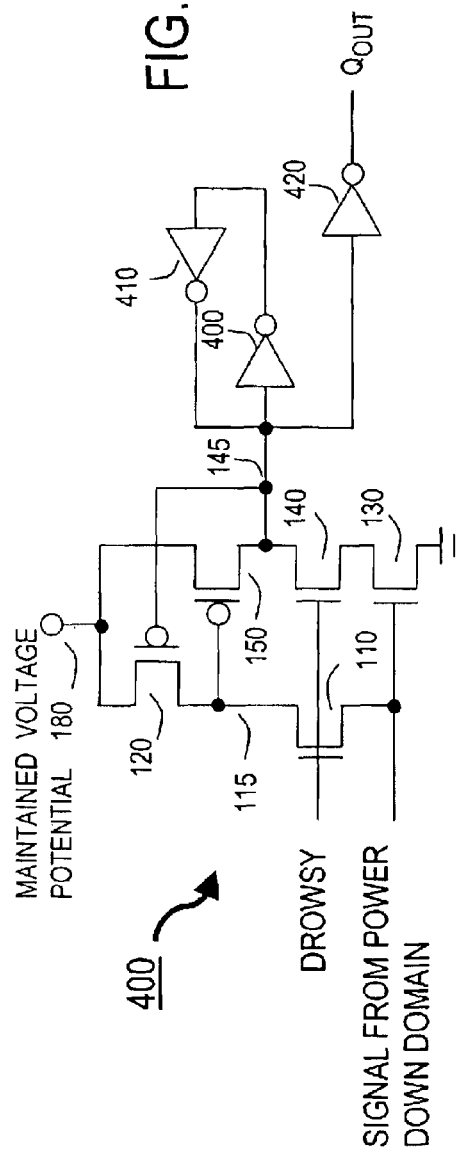
FIG. 4 is a schematic for a fourth embodiment of a voltage translator circuit operating between domains where one domain may retain power.

FIG. 4 is a schematic for a fourth embodiment of a voltage translator circuit 400 operating between domains where one domain may retain power. This embodiment includes transistors 110, 120, 130, 140 and 150 that are connected the same as shown in FIG. 1. This embodiment differs from the embodiment illustrated in FIG. 1 in that a latch consisting of inverters 400 and 410 is connected to node 145, with a buffer 420 providing the output signal $Q_{OUT}$. All transistors may have thin gate oxides. This circuit is useful for latching signals coupling different voltage domains with or without level shifting, where power may be removed from the domain that supplies the input signal "SIGNAL FROM POWER DOWN DOMAIN".

In operation, the signal DROWSY may be asserted high for active operation. The signal DROWSY may be generated by circuitry supplied by a lower voltage power supply. A logic zero or logic one may be written to voltage translator circuit 400 by application of a voltage at the gate of transistor 110. If the input is written with a zero value, then node 115 is pulled low and node 145 is pulled high, latching a one value that is indicated by the output signal $Q_{OUT}$. On the other hand, if the DATA input is written with a logic one value (at the lower $V_{CC}$), then transistor 130 is conductive and node 145 is pulled low, latching the opposite state as indicated by a logic zero value for the output signal $Q_{OUT}$.

Figure 5:
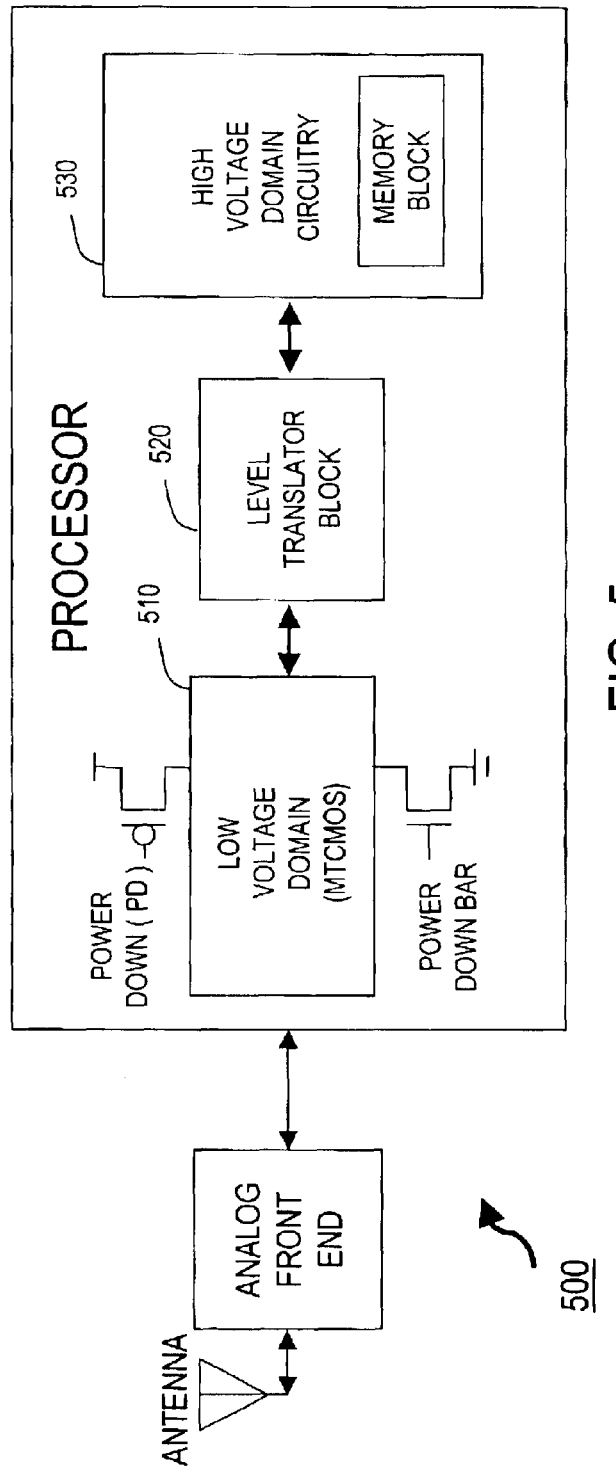
FIG. 5 is a block diagram that illustrates a wireless system where the present invention may be practiced.

FIG. 5 is a block diagram that illustrates a wireless system 500 where the present invention may be practiced. Wireless system 500 includes a low voltage domain 510 and a high voltage domain 530. Low voltage domain 510 may use a Multi-threshold Complementary Metal Oxide Semiconductor (MTCMOS) circuit style to provide high performance and low power operation by utilizing both high and low threshold transistors, i.e., thick-oxide and thin-oxide transistors. By using low threshold transistors in the signal path, the supply voltage may be lowered to reduce switching power dissipation. By proper use of high threshold and low threshold transistors the subthreshold leakage current may be limited, and therefore, prevented from dominating the switching power.

However, standby (leakage) power is exponentially increased when the threshold voltage is reduced. Consequently, in order to limit this power component it may be desirable to eliminate power to circuitry in some parts of the integrated circuit. The circuit of FIG. 3 can retain the previous state while circuitry driving node data is powered off or provides ambiguous logic values during a power-down or power-up sequence.

In contrast to low voltage domain 610 operating with a low voltage potential, high voltage domain 530 may include a memory with cells that fail if operated at the low voltage potential supplied to low voltage domain 510. Memory cells may be susceptible to an imbalance in current conduction paths from processing variations and may become unstable at low voltages. Therefore, high voltage domain 530 is designed to receive a separate and higher operating voltage than the regulated operating voltage received by low voltage domain 510. Thus, high voltage domain 530 may be maintained at a fixed voltage value that provides memory cell stability while the operating voltage of low voltage domain 510 may be adjusted for performance, power, etc. of wireless system 500. Other devices, e.g., flash memory, may require that high voltage wordlines be supplied when addressing the memory array.

Level translator block 520 includes either voltage translator circuit 100, 200 or 300 (as illustrated in FIGS. 1, 2 and 3) to provide an interface for electrical signals passed from low voltage domain 510 to high voltage domain 530. For instance, a microprocessor core in low voltage domain 510 may generate signals that transition between ground and the operating voltage of low voltage domain 510, using translator block 520 to adjust those signals to transition between ground and an operating voltage suitable for a memory block in high voltage domain 530. Address lines may be decoded using a decoding circuit (not shown) in low voltage domain 510, with output signals generated by the decoding circuit passed to translator block 520 to select a word line properly adjusted for reading and writing the memory cell during a read/write memory operation.

By now it should be apparent that a wireless system has been presented that illustrates using circuitry in a low voltage domain and a high voltage domain, with an interface voltage translator block capable of adjusting the amplitude of signals passed between the two voltage domains. The separate voltage domains may allow the microprocessor and the memory block to be integrated together and operate efficiently while satisfying different criteria.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A translator circuit comprising:
   first and second cross-coupled transistors having sources commonly coupled to a first power conductor;
   first and second stacked transistors, where a drain of the second stacked transistor is coupled to a drain of the second cross-coupled transistor and a source of the first stacked transistor is coupled to a second power conductor; and
   a third transistor having a drain coupled to a drain of the first cross-coupled transistor, a source coupled to a gate of the first stacked transistor, and a gate coupled to a gate of the second stacked transistor.

2. The translator circuit of claim 1 wherein the first and second cross-coupled transistors are P-channel MOS transistors and the first and second stacked transistors and the third transistor are N-channel Metal Oxide Semiconductor (MOS) transistors.

3. The translator circuit of claim 1 further including a first inverter having an input coupled to the drain of the second stacked transistor.

4. The translator circuit of claim 3 wherein an output of the first inverter drives a wordline of a memory.

5. The translator circuit of claim 3 further including a second inverter having an input coupled to an output of the first inverter and an output coupled to the input of the first inverter.

6. The translator circuit of claim 5 wherein an output of a latch formed by the first and second inverters is controlled by a DROWSY signal or a signal generated by circuitry in a low voltage domain.

7. The translator circuit of claim 1 wherein the first and second cross-coupled transistors are processed with a gate oxide that is thicker than a gate oxide of the first and second stacked transistors and the third transistor.

8. A communication device comprising:
   an analog circuit coupled to an antenna to receive a modulated signal;
   a processor coupled to an output of the analog circuit to receive a digital value based on information in the modulated signal, where the digital value is translated in voltage by a level translator from a first voltage domain to a second voltage domain for storage in a memory, the level translator including,
   first and second cross-coupled transistors coupled to a first power conductor;
   first and second stacked transistors coupled between the first cross-coupled transistor and a second power conductor; and
   a third transistor coupled between the second cross-coupled transistor and a gate of the first stacked transistor, where a gate of the third transistor is coupled to a gate of the second stacked transistor.

9. The communication device of claim 8 wherein the first and second cross-coupled transistors are processed with a gate oxide that is thicker than a gate oxide of the first and second stacked transistors and the third transistor.

10. The communication device of claim 8 wherein the first and second cross-coupled transistors, the first stacked transistor and the third transistor are processed with a gate oxide that is thicker than a gate oxide of the second stacked transistor.

11. The communication device of claim 10, further including a two-inverter latch having an input coupled to a drain of the first stacked transistor.

12. The communication device of claim 11 wherein transistors in the two-inverter latch are processed with a gate oxide that is thicker than a gate oxide of the second stacked transistor.

13. A translator circuit comprising:
   a first transistor having a gate to receive a data signal;
   a second transistor having a gate to receive a control signal and having a source coupled to a drain of the first transistor;

a third transistor having a gate to receive the control signal and having a source coupled to the gate of the first transistor; and cross-coupled transistors coupled to a drain of the third transistor and a drain of the second transistor.

14. The translator circuit of claim 13 wherein the first, second and third transistors are processed having a gate oxide with a thickness that is less than a gate oxide of the cross-coupled transistors.

15. The translator circuit of claim 13 wherein the first, second and third transistors are N-channel MOS transistors and the cross-coupled transistors are P-channel transistors.

16. The translator circuit of claim 13 further including an inverter having an input coupled to the drain of the second transistor and an output to provide a signal.

17. The translator circuit of claim 13 wherein the first transistor is processed having a gate oxide with a thickness that is less than a gate oxide of the second and third transistors.

18. The translator circuit of claim 13 further including a latch having an input coupled to the drain of the second transistor and an output to provide a signal.

19. A method comprising:

receiving a control signal and a data signal generated in a first voltage domain by a translator circuit operating in a second voltage domain;

translating the data signal having an amplitude based on the first voltage domain to an amplitude based on the second voltage domain when the control signal is active;

generating an output signal based on the control signal and data signal; and using a source follower having a gate to receive the control signal and a source to receive the data signal to change the output signal.

20. The method of claim 19, further including:

increasing the amplitude of the data signal when the first voltage domain is a lower voltage potential than the second voltage domain.

21. The method of claim 19, further including:

decreasing the amplitude of the data signal when the first voltage domain is a higher voltage potential than the second voltage domain.

* * * * *

UNITED STATES PATENT AND TRADEMARK OFFICE
CERTIFICATE OF CORRECTION

PATENT NO. : 6,774,696 B2  
DATED : August 10, 2004  
INVENTOR(S) : Clark et al.

It is certified that error appears in the above-identified patent and that said Letters Patent is hereby corrected as shown below:

Column 2,
Line 52, delete "15".

Column 5,
Line 15, delete "610" and insert -- 510 --.

Signed and Sealed this

Twenty-first Day of December, 2004

JON W. DUDAS
*Director of the United States Patent and Trademark Office*